United States Patent [19]

Kuijk

[11] Patent Number: 4,584,673
[45] Date of Patent: Apr. 22, 1986

[54] SERIES/PARALLEL/SERIES SHIFT REGISTER MEMORY SYSTEM

[75] Inventor: Karel E. Kuijk, Eindhoven, Netherlands

[73] Assignee: U.S. Philips Corporation, New York, N.Y.

[21] Appl. No.: 501,320

[22] Filed: Jun. 6, 1983

[30] Foreign Application Priority Data

Jun. 11, 1982 [NL] Netherlands ............ 8202364

[51] Int. Cl.[4] .................. G11C 19/08; G11C 19/28
[52] U.S. Cl. ............................. 365/219; 365/1; 365/78; 365/200; 371/36; 371/38
[58] Field of Search ............ 365/1, 15, 78, 183, 365/200, 219; 371/36, 38

[56] References Cited

U.S. PATENT DOCUMENTS

| | | | |
|---|---|---|---|
| 3,675,200 | 7/1972 | Bossen et al. | 371/38 |
| 4,073,012 | 2/1978 | Ohnigian et al. | 365/15 |
| 4,092,734 | 5/1978 | Collins et al. | 365/183 |
| 4,404,673 | 9/1983 | Yamanouchi | 371/38 |

Primary Examiner—James W. Moffitt
Attorney, Agent, or Firm—Jack E. Haken; James J. Cannon, Jr.

[57] ABSTRACT

A series/parallel/series shift register memory system having storage positions provided on a substrate. In addition to the single parallel-connected storage registers required to achieve the nominal storage capacity, there are provided groups of first and second nominally redundant single storage registers. The first redundant registers are used as substitutes for faulty single storage registers, so that the nominal storage capacity can be maintained. The second redundant registers are used for the transport of redundant code data. Also provided is a multi-state sequencer for indicating, in each state, the information to be carried by a particular group of storage registers and for forming, on the basis of this information, an error-detecting or error correction code which is carried by the second redundant storage registers. Faulty storage registers can thus be pin-pointed, after which dummy information is automatically inserted in the input information at locations which are such that it will nominally be carried by the faulty registers, thus effectively substituting a first redundant register for each faulty register. The system is thus self-healing.

8 Claims, 7 Drawing Figures

SERIES/PARALLEL/SERIES SHIFT REGISTER MEMORY SYSTEM

BACKGROUND OF THE INVENTION

1. Field of the Invention

The invention relates to a series/parallel/series shift register memory comprising a substrate on which there are provided storage positions for the storage of a data element which is represented in a multivalent, single, physical quantity in each storage position, said shift register memory comprising a serial data input for electric signals, a converter for converting a signal received into the representation of a data element, a series input register which is connected to the converter and which comprises n>1 switch positions, a number of n single storage registers each of which is connected to a switch position and which comprise at least two storage positions in order to form a parallel storage register, a series output register which is n-fold connected to the parallel storage register by way of a relevant second switch position and which comprises a serial data output, said shift register memory comprising a transfer control device for transferring, after the reception of n data representations in the series input register, these representations in parallel to the parallel storage register in a recurrent manner and for presenting a corresponding number of data representations from the parallel storage register to the series output register, said transfer control device otherwise activating only the series input-/output registers, said transfer control device also serving to ignore single storage registers which have been indicated as being faulty on the basis of one or more fault indicators stored in an indicator memory, and to conduct the relevant data representations for each indicated single storage register via a relevant first redundant, single storage register.

2. Description of the Prior Art

In one known such shift a register memory described in U.S. Pat. No. 4,155,121 each physical quantity is an electric charge stored in an integrated capacitor, which charge is advanced in steps by electric drive signals; such memories are so-called charge coupled devices which are a subcategory of charge transfer devices. The data elements may be discrete and bivalent, discrete and multivalent or even analog. In another known such shift register memory described in U.S. Pat. No. 4,073,012 the physical quantity is a local magnetization in a ferrimagnetic substrate, i.e. a magnetic bubble. The magnetic bubbles can be driven by a magnetic field which rotates in the plane of the substrate, by energizing current conductors provided on the substrate or in another way. The data elements are usually (but not exclusively) discrete and bivalent. During the manufacture of such memories faults occur, these being usually located in the comparatively large area in which the single storage registers are situated. The yield of the manufacturing process can be increased by providing extra and therefore nominally redundant single storage registers which, if one or more faulty single storage registers occur, are used instead. The detection of faulty storage registers may take place during manufacture. During its manufacture and prior to the assembly of the substrate with the memory in a memory system, however, such a memory is volatile so that an expensive bookkeeping system is necessary in order to obtain an up-to-date record of the fault locations in each shift register memory during the successive manufacturing steps. These locations may differ from one memory to another. Moreover, additional problems may arise because (further) single storage registers could become faulty during operation.

SUMMARY OF THE INVENTION

It is an object of the invention to provide a memory of the kind set forth which is self-learning so that the bookkeeping concerning the faulty single storage registers is performed in circuitry which is directly coupled to the shift register memory, the localization and correction of faulty single storage registers being performed by means of at least two groups of redundant single storage registers.

The invention is characterized in that there is provided a multi-state sequencer which comprises at least two states for indicating in each relevant state, for the input register as well as for the output register, a group of data representations associated with a relevant group of single storage registers, and for adding to the indicated group of data representations redundant data representations formed according to an error detecting code, and for conducting said redundant data representations, together with the indicated group of data representations, via second redundant single storage registers, the relevant group of data representations again being indicated when presented to the output register, an error detection device being connected to the serial data output in order to indicate by way of said code, an originating single storage register as being "good" or at least "suspect" for an indicated group of data representations, the latter indication information being applied to the indicator memory in order to form a fault indicator.

An error-detecting code is to be understood to mean herein a code which is capable of indicating whether a group of single storage registers has operated properly or incorrectly, subject to the condition that only a given amount of malfunctioning has occurred. When more faults occur, the code need not produce the correct detection result. Evidently, a given state of the multi-state sequencer may indicate different groups of data representations in the input and output registers. It is to be noted that the indication of a data representation also implicitly indicates an associated single storage register. An error-detecting code for analog data is obtained, for example, by the double supply to relevant storage registers. An excessively large discrepancy on the output then indicates the situation "suspect". A sufficiently high number of indications "suspect" implies the qualification "bad".

Under the control of a transfer signal, the multi-state sequencer is preferably advanced to a next state of a cycle of states, each relevant single storage register being indicated in at least one state of the multi-state sequencer. The entire shift register can thus be systematically tested in a repetitious manner, so that a faulty single storage register will be quickly detected. Advancing may take place for each transfer, but this is not necessary per se.

Preferably, said code is an error correction code. An error correction code is to be understood to mean herein a code which is capable of correcting a data bit representation of a faulty single storage register within a group of single storage registers, subject to the condition that only a given amount of malfunctioning has occurred. When the amount of malfunctioning is larger, the wrong single storage register may be indicated as being faulty. In the case of a correctly functioning error correction code, however, any faulty single storage register will be unambiguously identified. Using an error-detecting code, usually only a group of single storage registers can be indicated as being "faulty". Thus, there are three different classifications: "good", no fault has been detected; "faulty": a fault has occurred in an identified single storage register; and "suspect": a fault has occurred but a single storage register cannot yet be identified.

Preferably, said code is a majority decision code. It has been found that the correction can thus be suitably performed in real time with the reception of the data bits.

The invention also relates to a memory system comprising at least two shift register memories of the described kind, there being provided a synchronization device for the isochronous driving of the latter shift register memories at least at the bit level. Two recurrent phenomena are isochronous when they exhibit each a fixed time position as regards the cycles of one another.

The invention also relates to a memory system comprising at least one shift register memory of the described kind which can be coupled to an output of a test pattern generator which is also included in the memory system, there being provided a control device which comprises a state "test" and a state "operational", the test pattern generator being activated exclusively in the state "test" after which automatically the state "operational" is assumed and the test pattern generator is deactivated. The state "test" may be activated, for example, each time when the power supply is switched on; in the state "operational", a tested memory is then present again.

The invention also relates to a display apparatus comprising a shift register memory or a memory system of the described kind, the storage capacity of the shift register memory or the memory system being sufficient for the storage of a two-dimensional picture frame organized in picture lines. It has been found that the requirement "100% reliable" need not always be imposed on such a picture and that it is often permissible to seek the faulty single storage registers again each time when the apparatus is switched on. When the number of faulty storage registers is not excessively large or when their distribution between the relevant indicated groups is not excessively irregular, the memory system will be reliable again after a switch-on phenomenon.

BRIEF DESCRIPTION OF THE DRAWINGS

Embodiments of the inventions will be described in detail hereinafter, by way of example, with reference to the accompanying diagrammatic drawings. In the drawings

DESCRIPTION OF THE PREFERRED EMBODIMENT

Figure 1A:
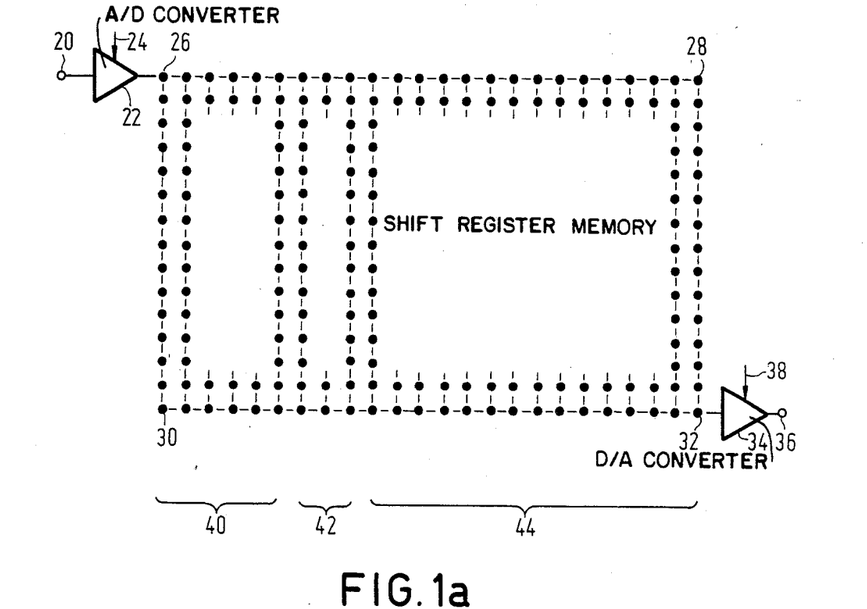
FIG. 1a is a diagram of a series/parallel/series shift register memory.

FIG. 1a is a diagram of a series/parallel/series shift register which may be included in an embodiment of the invention. The storage positions are indicated by black dots; the physical aspects of such storage positions have been adequately disclosed in the literature and will not be elaborated upon herein. Element 20 is a serial data input for electric signals. For the sake of simplicity it is assumed hereinafter that storage positions can contain only bivalent data. The technique of multivalent or analog data storage per se is well known. Element 22 is a converter for converting successive values of the electric signals into bivalent representations thereof; for the sake of simplicity any problems relating to analog-to-digital conversion will be neglected herein. The converter 22 can receive a separate synchronization or control signal on line 24. All storage positions between and including those indicated by references 26 and 28 constitute switch positions because they can receive a data representation from one side and can selectively output this representation to one of two further sides. The register shown comprises 24 of such switch positions, which together form a series input register. The storage positions between and including those indicated by references 30 and 32 also constitute switch positions in that they can receive a data representation from two sides and can output this representation to one further side. In the register shown there are 24 of such switch positions, these together forming a series output register. 13 storage positions are situated between those indicated by references 26 and 30, these positions together forming a single storage register. There are 24 of such single storage registers. Connected to the series output register is a converter 34 for supplying an electric signal on an output 36 so that the temporarily stored data becomes available for further use. A synchronizing control signal may also be received on input 38. The memory is organized in three sections. Section 44, comprising a 15×13 storage position parallel storage register plus the relevant portions of the input and output registers, can accommodate the nominal amount of data for which the memory size is chosen. The memory is operated as follows. Data is presented in 15 successive periods of the drive of the series input register. When the resulting stored representations are aligned with the section 44, they are transferred one position downwards in parallel by the activation of the input switches. At the same time an equal amount of data is applied to the series output register and, furthermore, all other representations in the parallel storage register are driven one position downwards. Simultaneously with the writing of the data into the series input register a corresponding amount of data is read out from the series output register. The cycle is subsequently repeated.

Section 42 comprises three first nominally redundant single storage registers which are provided in order that the nominal storage capacity can be achieved even when as many as three faulty single storage registers are present in the section 44. One possibility is to substitute one of the registers in the section 42 for one of the registers in the section 44; this will require that the order of the data representations be modified as regards the series input and series output registers. In the embodiment to be described hereinafter, however, the order of the data bits is maintained; for example, when the extreme right single storage register is faulty, the part of the memory to be used is shifted one single storage register to the left. As another example, when the fifth single storage register from the right is faulty, the first four registers from the right are used normally while the remaining part of the memory to be used is shifted one single storage register to the left. In the case of there being several faulty single storage registers (for example, upto as many registers as there are contained in the section 42, i.e. at the most three), corresponding procedures are followed. The section 40 comprises a number of second nominally redundant single storage registers. Together with the shifting in or each series of 15 data representations in the described manner, a series of six data bit representations is shifted in in order to form in conjunction with a sub-group of said fifteen representations, a code by means of which errors can at least be detected and possibly even be corrected. Such codes will be described in detail with reference to FIGS. 2 and 3. The storage time of the series/parallel/series shift register memory shown equals 14×24 periods of the drive for all single storage registers (including the redundant storage registers). The introduction of differences in the length of the single storage registers is described in a co-pending U.S. patent application Ser. No. 501,464 filed Jun. 6, 1983 based on Netherlands patent application No. 8202365. Furthermore, in given cases it will be advantageous to extend the serial input and/or output registers by one or more storage positions in order to achieve, for example, a more advantageous time-relationship between the input data and the output data.

Figure 1B:
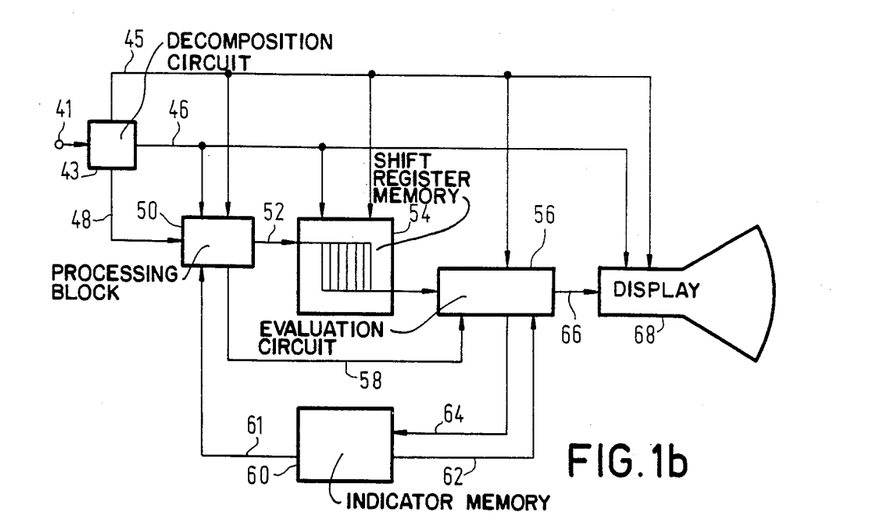
FIG. 1b is a block diagram of a display apparatus which includes an embodiment of the invention.
Figure 4:
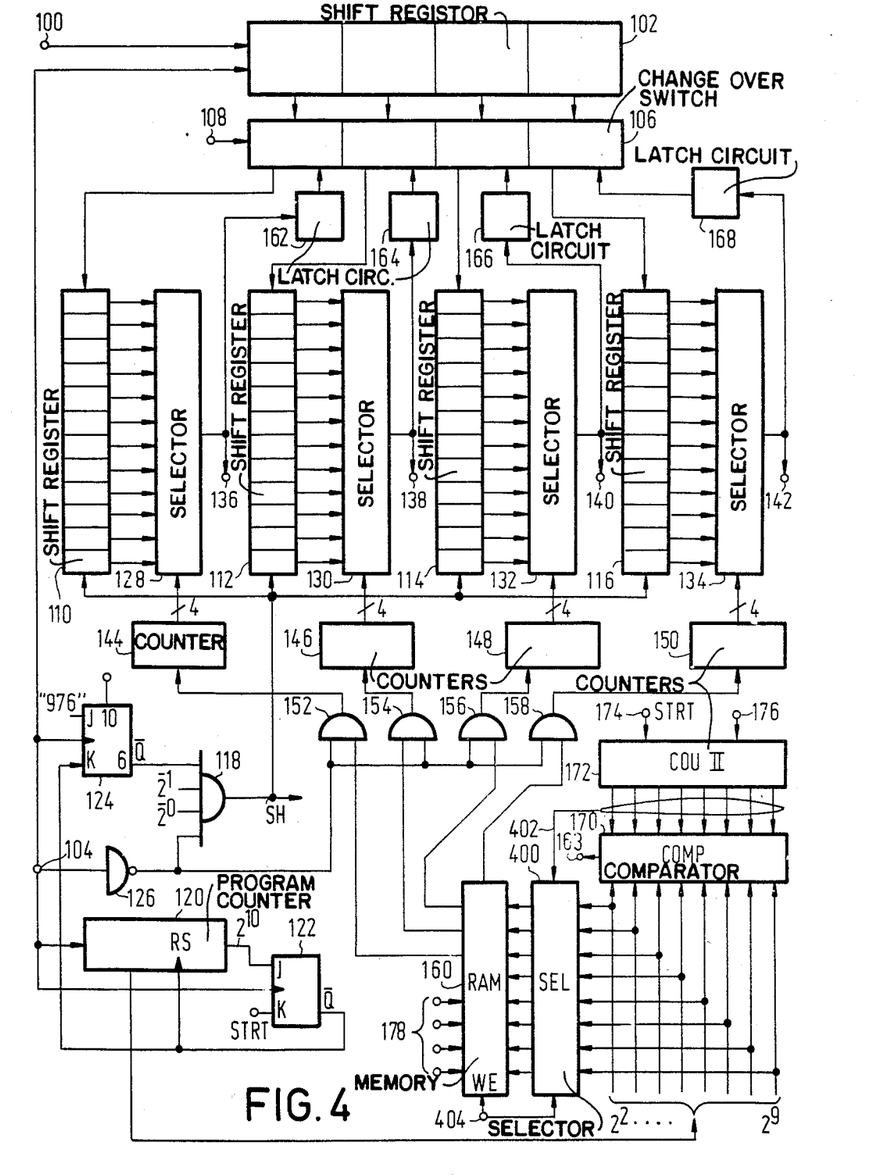
FIG. 4 is a diagram of, inter alia, a first part of a multi-state sequencer.
Figure 5:
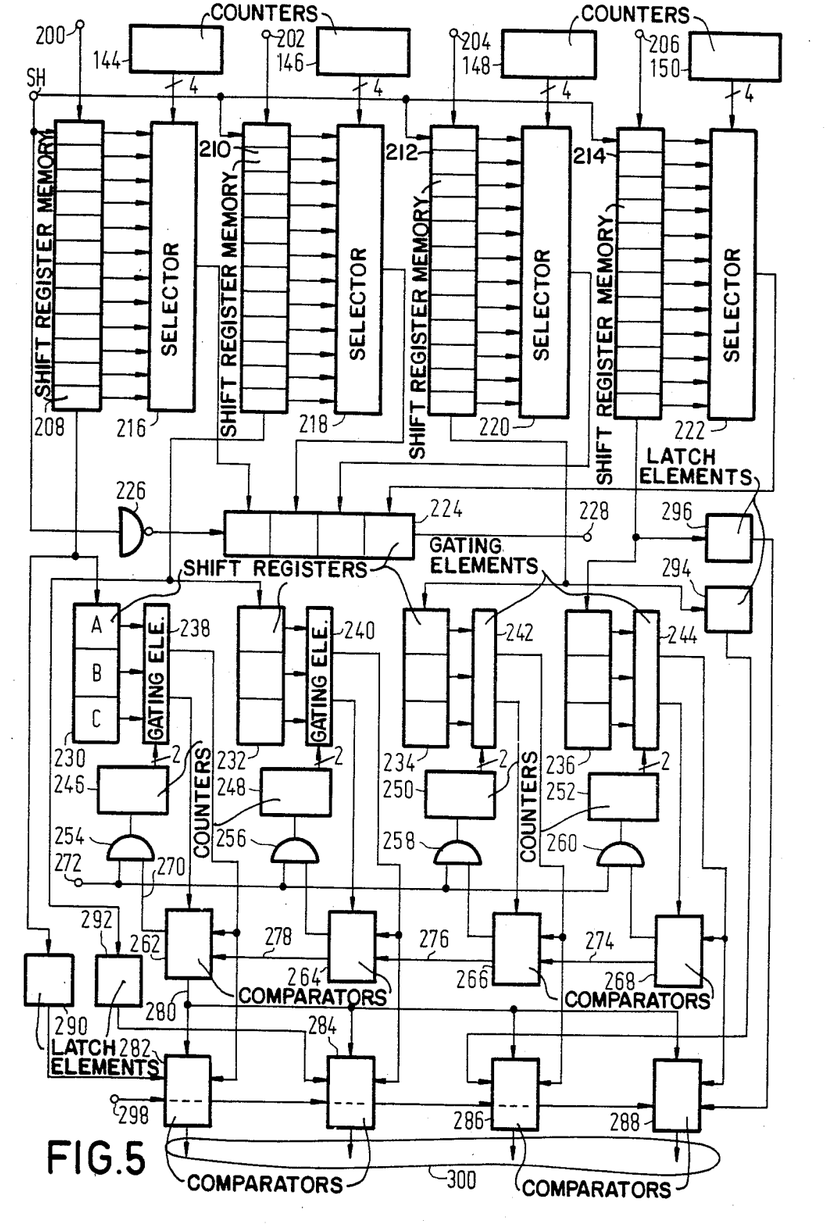
FIG. 5 is a diagram of, inter alia, a second part of this multi-state sequencer, and FIG. 6 diagrammatically shows the different categories of bits occurring during a picture line.

FIG. 1b is a block diagram of a display apparatus which includes a picture memory which is based on the organization shown in FIG. 1a. The picture is organized as a normal television picture, for example according to the Continental standard. The composite video signal arrives on input 41. In this example a pixel frequency of 4 times the color subcarrier frequency is chosen, so approximately 17.7 MHz. A picture line (excluding its flyback time) of 52 microseconds therefore comprises 920 pixels. The pixel frequency, and the line and frame flyback signals are derived from the composite video signal in a decomposition circuit 43. Furthermore, for each pixel the analog data is converted into a bit series of, for example, 8 bits which appears on output 48. The processing arrangement for only one of these 8 bits is shown in the Figure. Processing block 50 includes part of a multi-state sequencer which is advanced through one of a predetermined, limited number of states by each line flyback signal on line 46. In each of these states the multi-state sequencer indicates a group of the 920 pixel bits received for the relevant line in order to supplement this group with a number of redundancy bits. Under the control of the pixel frequency signals on line 45 the processing block 50 outputs on output 52: the 920 pixel bits, the redundancy bits formed so that an error detecting code results, and a number of dummy bits which are applied to those single storage registers which are not to be effectively used. The sequence in which the various categories of bits appear on the output 52 may be aribtrary per se; this sequence defines the various sections in an organization as shown in FIG. 1a. Faulty single storage registers are effectively not used; this is achieved under the control of data from an indicator memory 60 on line 61. Furthermore, it is ensured that those of the first nominally redundant single storage registers which are not yet needed are effectively not used either; only 920 in total need be usable for the picture data itself. The series/parallel/series shift register memory 54, which is organized as shown in FIG. 1a is connected to output 52. This memory receives the pixel frequency signals for activation of the serial input/output registers and for the converters 22 and 34 of FIG. 1a. The memory 54 also receives the line flyback signals for activation of the single storage registers. This simplified set-up does not show the circuit required for supplying the correct number of activation pulses to the series input/output registers per picture line. This number equals 980 in the detailed embodiment being described. (In another embodiment two or more memories 54 may be connected to the output of the processing block 50 in order to store a complete picture). Block 56 represents an evaluation circut for classifying a single storage register as being good, suspect or faulty; it includes the remainder of the multi-state sequencer and, on line 58 from the processing block 50 it is supplied with the indication information which indicates the group of single storage registers with which the redundant bits are associated for the relevant outputted line. If appropriate on line 62, the evaluation circuit 56 also receives from the indicator memory 60 the data indicating which single storage registers are suspect. It will usually be the case that the data on the lines 61 and 62 always correspond, it being assumed that those single storage resisters which operate correctly during the inputting of a given amount of data bits still operate correctly when the same amount of data is outputted. This is so in the particular construction for the blocks 50, 56 and 60 to be described hereinafter (FIGS. 4, 5). However occasionally this assumption will not be justified, so that temporarily the horizontal positioning of some of the pixels displayed may become shifted through one or more places relative to where they should be. When the evaluation circuit 56 detects that a given single storage register which was considered to be "good"]or "suspect" thus far has become faulty, this information is applied to the indicator memory 60 with line 64. This results in a modification of the information on the lines 61 and 62 so as to indicate that the relevant single storage register may no longer be used. In as far as is feasible and in as far as the system is adapted for this purpose (not in FIG. 5), information which has been found to be incorrect is corrected in the evaluation circuit 56. The pixel information is then presented on output 66 in reformatted form and without the previously added redundant information. To this output there is connected the actual display device 68, possibly including a digital-to-analog converter which may be of a conventional type. The display device also receives the pixel frequency (for the reconstruction of the analog picture signals), the line flyback signals and the frame flyback signals. The picture memory can be used to perform particular operations on the data which would not be possible without storage. Faults, for example drop-outs which could occur in a storage medium such as a magnetizable tape can thus be removed from the picture. Other operations on the picture may concern the recognition of shapes and the accentuation of given phenomena. Alternatively, the picture memory may serve to retain the picture for some time, for example in order to present a "stationary" television picture to the display device; the shift register memory will then be provided with a feedback circuit. A selector switch for applying or not applying picture data to the shift register memory as desired may also be present. It is also possible to connect a number of picture memories in parallel, each memory being provided with its "own" position of a selector switch.

Figure 2:
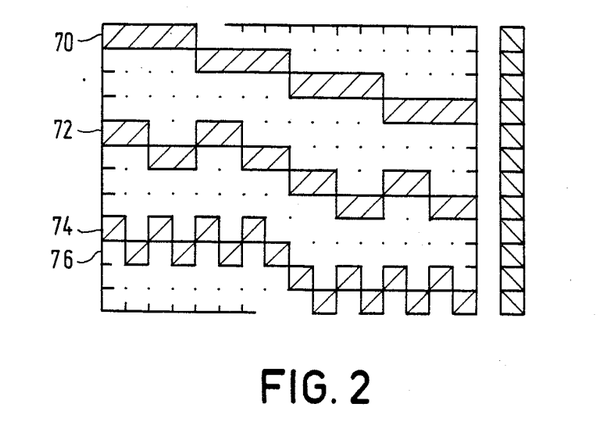
FIG. 2 illustrates the use of an error detecting code in a self-learning system.

FIG. 2 illustrates the use of an error-detecting code in a self-learning system. The Figure shows twelve lines each containing sixteen pixel bits, each bit being symbolized by a square. The sixteen pixel bits of each line are shifted through respective ones of single storage registers in an arrangement similar to that described with reference to FIG. 1a and indicated at 54 in FIG. 1b. The pixel bits indicated by the multistate sequencer (four on each line are hatched. The last column indicates the redundancy which is added; this consists of a single parity bit associated with the indicated bits on each line so that a single-error detecting code is obtained, for example in that the number of "ones" in the five hatched squares on each line must be odd. If the number of "ones" is even, the indicated bits on the relevant line are "suspect". It is assumed that the redundancy bit is always "good". If, for example, the number of ones in the five hatched squares on each of the lines 70, 72 and 74 is "even", it can be deduced that the first bit on each of these lines, and hence the first bit on all lines, is likely to be "incorrect". If on the other hand the number of "ones" on the lines 70 and 72 is even but the number of "ones" on the line 74 is odd, as is the number on line 76, the error detection may be inhibited by the specific data content of the relevant line; for example, it may be that a single storage register always outputs a signal "1". If, therefore, the relevant data is actually a "1" in such a case, no error is introduced. Thus, in this particular example a single storage register which gives rise to an error which always becomes manifest can be localized (pin-pointed) after twelve lines have been investigated (it is assumed that at the most one of every 8 storage registers is faulty). In order to pin-point a register which gives rise to an error which does not always become manifest, the data of a larger number of picture lines must be investigated and the results combined. A "suspect" single storage register may be considered to be "good" again after a given number of correct results have been obtained in respect of it; until that moment arrives it may still be treated as being "faulty"; while that is the case must still be used but the relevant data must also be copied into a nominally redundant single storage register.

Figure 3:
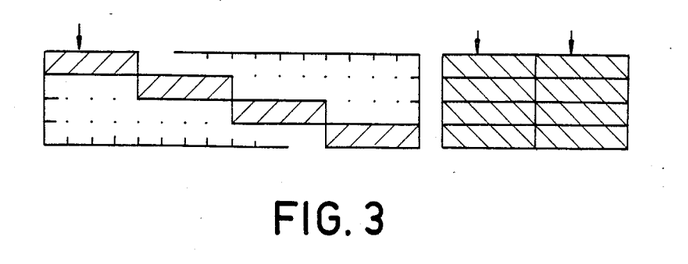
FIG. 3 illustrates the use of an error correction code in a self-learning system.
Figure 6:
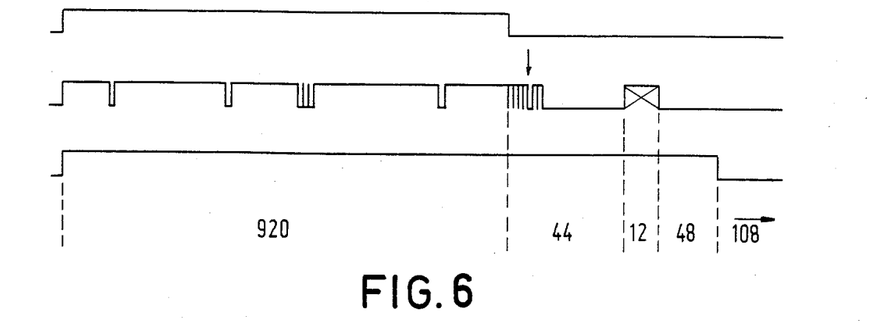

FIG. 3 illustrates the use of an error detection/error correction code in a self-learning system. Again it is assumed that sixteen pixel bits relating to each successive picture line are shifted through respective ones of sixteen single storage registers, and that for each line four of these (hatched) are indicated by the state sequencer. Now it is assumed that there are also eight nominally redundant single storage registers each group of four of which store one set of duplicates of the indicated data. A bit-wise majority decision is taken in the error detector/error corrector in respect of each indicated bit and its two duplicates. The indication "good"/"faulty" for a single storage register follows directly therefrom. It is assumed that at the most one of the three storage registers corresponding to a particular bit (those storing the actual bit and its two duplicates; so, for example, the registers 2, 18 and 22 indicated by arrows) is faulty. Thus, any register which gives rise to an error which always becomes manifest can be pinpointed (localized) after four lines have been investigated. It whould be noted however that, in practice, on the average a register fault, when present becomes manifest no more than half of the corresponding bits, and often the incidence will be even less frequent. Therefore, usually more time will be required. The organization which will be described hereinafter with reference to FIGS. 4 to 6 is based on a modification of the process described with reference to FIG. 3. However, other possibilities also exist, for example:

the error detection operates in blocks; when a fault is detected by means of the process of FIG. 2, the entire block of four single storage registers indicated by the sequencer is taken to be faulty;

the code does not use a majority system as described with reference to FIG. 3 but corrects "directly". When a fault is present in a group of four indicated single storage registers, one error due to that fault can be corrected by means of the redundant storage registers if a code with a minimum Hamming distance of three over the bits is used. When use is made of a minimum Hamming distance of four, which of the relevant single storage registers is the culprit can be detected in addition. A further increase of the minimum Hamming distance enables further corrections to be carried out (at the expense of requiring more elaborate operations);

it is not necessary to conduct the redundant information through fixed, single storage registers; a given register can be used for the original data and for redundant data as alternatives.

FIG. 4 shows a first part of a multi-state sequencer in combination with inter alia an indicator memory. (The arrangements shown in FIGS. 4 and 5 together substantially make up the blocks 50, 56 and 60 of FIG. 1b). The data bits derived from line 48 of FIG. 1b, arrive serially on terminal 100; these bits are stored in a shift register 102 which can accommodate four such bits. The shift pulses for this shift register, the pixel clock signals, appear at a frequency of 17.7 MHz (a harmonic of the sub-carrier frequency) on terminal 104 in this embodiment, terminal 104 being fed from line 45 of FIG. 1b. To this terminal there are inter alia connected a block 120 which represents a program counter to which a decoder is connected. Element 106 is a quadruple changeover switch which has four parallel inputs from the shift register 102. The switch 106 is controlled by a selection signal on terminal 108, which signal is derived from the program counter 120. At the beginning of a picture line the parallel output lines of the shift register 102 are coupled to the series inputs of respective shift registers 110 to 116. These are modules of the type SN 74164 (make TEXAS Instruments Corporation) having a storage capacity of 12 bits each. The shift pulses for these shift registers 110 to 116 are derived from an AND-gate 118 and have a frequency of 17.7/4 MHz. To this end, this AND-gate receives the pulses from input 104 via an inverter 126 and also the inverted outputs $\overline{2}^0$ and $\overline{2}^1$ of the program counter 120. Thus, in the present embodiment the 920 data bits of each picture lines (the internal of occurrence of which in the relevant complete line period is signified by the "high" portion of the uppermost line in the time diagram of FIG. 6) are taken up in a 1-to-4 multiplex organization; this is because the described arrangement is designed for use with a magnetic bubble memory for which the pixel frequency is too high. Other multiplex organizations could, of course be realized in a manner which is similar to that shown. When the capacity of the series/parallel/series shift register memory is sufficiently high, and this memory can accommodate a sufficiently high control frequency, a multiplex organization will not be necessary.

The program counter in block 120 consists of three cascade-connected dividers-by-sixteen of the type SN 74163. The counter comprises the successive divider stage outputs $2^0$-$2^9$ from which, if necessary, the relevant inverted signals $\overline{2^0}, \overline{2^1}, \ldots$ are formed. The decoding is performed by comparators which compare the counter content with a permanently adjusted standard number and which output a pulse-shaped signal of the correct polarity in the case of correspondence. The counter counts to 1023, which fits easily within a picture line of 64 microseconds (including line flyback period). The divider state output $2^{10}$ is connected to the J-input of a JK-flip-flop 122 (type Sn 74107A). Thus, when the counter has counted from 0 to 1023, the flip-flop is switched over. The inverted output ($\overline{Q}$) of the flip-flop returned to the reset inputs of each of the three dividers of the counter 120 and, for the purpose of stopping the count, also the "count-enable" connection pins 7 and 10 of the least-significant one of the three dividers-by-sixteen. The counter is therefore stopped and reset when it has counted to 1023. A start signal STRT is applied to the K-input of the flip-flop 122, so that when this occurs flip-flop 122 is switched back and the counter is started again. This signal can be formed at the beginning of each picture line in a conventional manner, for example in response to the line flyback signal (line 46 of FIG. 1*b*).

A flip-flop 124 determines the number of shift pulses applied to the shift registers 110–116 during each line. This flip-flop of the type SN 74107 receives a shift pulse termination signal on its J-input. This could be, for example, the same signal "$2^{10}$" which is received by the flip-flop 122. In order to save storage space, however, a signal which indicates that the counter in block 120 has received 976 pulses (920+44+12) is more advantageous. The $\overline{Q}$ output signal of the flip-flop 122 arrives on the K-input of flip-flop 124. The shift registers 110–116 receive a shift pulse each time the series/parallel conversion shift register 102 has received four bits. The elements 128–134 are selectors of the type SN 74150. Twelve inputs of each detector are connected in parallel to the outputs of the associated shift register (110–116) and its output is connected to an output (136–142) which corresponds to output 52 in FIG. 1*b* and is connected in turn to an associated series/parallel/series shift register memory (not shown); each of these memories (which together correspond to memory 54 in FIG. 1*b*) need store only ¼ of the picture in the present embodiment. The selectors 128–134 are controlled by the output signals of respective four-bit counters 144–150. Initially, all these counters are in the state "0" so that the output of the first stage of the associated shift register (110–116) is connected directly to the relevant output (136–142). The further count states of a counter result in the output of the second stage, the third stage, etc., respectively of the associated shift register becoming connected directly to the relevant output. Thus, a larger delay between the shift register input and the relevant output 136–142 is introduced each time a counter is incremented and dummy bit positions (in fact containing duplicates of the immediately preceding bits) are formed in the output data stream. The formation of such dummy bit positions is symbolized in the second line of the time diagram of FIG. 6 in which six of such positions occurring in the interval "920" are indicated by an interruption in the bit stream (a "high" signal indicates "relevant" information, regardless of whether it concerns a "0" or a "1"). A dummy bit position is formed each time one of the counters 144–150 receives an increment signal. Because of the construction of the selectors 128–134, a maximum of 4×11=44 dummy bit positions can be created during a given line period. If this maximum number is created the time interval during which the output data bits occur will expand from simply the interval "920" in FIG. 6 to cover also the time interval which is denoted by the reference numeral "44" in FIG. 6. The counters 144–150 receive their increment signals from respective AND-gates 152–158 the inputs of each of which receive the inverted clock pulses from the element 126 and an associated output signal from a read/write memory 160 respectively, (memory 160 corresponding to memory 60 in FIG. 1*b*). In the present embodiment each picture line is divided between four channels 920/4=230 pixels being fed to each. Eleven first nominally redundant single storage registers are implemented for each channel, so that 11/(230+11)≈5% of the single storage registers may become faulty before the system ceases to be able to cope. The memory 160 has a storage (RAM) capacity of 256 ($2^8$) words of 4 bits each. Each word in which one or more ones occur makes the counter (counters) associated with the word bit position(s) at which the one(s) occur(s) receive an increment signal when it is read. Because at the most 976 relevant or irrelevant bits are applied to the series/parallel/series shift register memories per picture line, the maximum capacity of the memory 160 will not be used. The memory 160 is addressed by the outputs $2^2 \ldots 2^9$ of the counter 120 which are connected to the memory 160 via an 8-fold 2-to-1 selector 400. The write enable signal (WE) on terminal 404 is also applied to the selector in order that the count in the counter 120 will be used each time as the read address. Write operations in the memory 160 will be described hereinafter. Because of the formation of the dummy bit positions, many of the bits containing information will appear on the output (136–142) at instants which are later than the instants corresponding to their positions in the picture line. Line 2 of FIG. 6 illustrates in interval "44" the cumulative effect at six of these dummy positions jsix bit positions containing information now occur in interval 44. Because of the multiplex organization these bit positions are not necessarily immediately adjacent each other, this is symbolized by a missing bit (arrow). The circuit of FIG. 4 also comprises four latch circuits 162–168 which are fed with the signals on the data outputs 136–142. The outputs of the latch circuits 162–168 feed the second set of data inputs of the quadruple changeover switch 106. The four latch circuits receive a storage control signal from the output 163 of an 8-bit comparator 170. Thus, when each storage control signal occurs (the control connection has been omitted for the sake of simplicity) four bits which are applied to the series/parallel/series shift register memory are also stored in the latch circuits; these four bits can thus, by changeover of switch 106, be subsequently applied to the shift registers 110–116 and hence to the data outputs 136–140 for the second time. An error-correction code of the type described with reference to FIG. 3 can thus be formed.

Element 172 is an 8-bit counter which is set to its zero state by a frame flyback signal STRT on input 174 and which is incremented by a line flyback signal on input 176. The counter content thus indicates the line number within the television picture. The output bits $2^2 \ldots 2^9$ from counter 120 arrive on the lower inputs of the comparator 170 in the described manner. For the first picture line, the comparator 170 supplies a "correspondence" signal for the first four pixels; for the second picture line for the second four pixels, and so on. Each time this occurs one data bit (possibly a dummy data bit) is stored in a redundant manner in each latch element 162-168. Data on input 178 of RAM 160 is derived from a comparator in the circuit of FIG. 5 which indicates the faulty single storage registers. When this occurs a write control signal appears on input WE (write enable) and selector 400 is switched over so that the write address is constituted by the content of counter 172 (on line 402). The element 160 thus forms the indicator memory. Only 964/4=241 of the 256 addresses of this memory are used.

FIG. 6, second line, shows a block marked "12". During these twelve bit periods, the quadruple switch 106 receives a control signal on its input 108, which signal is derived from the count in the program counter 120 by way of a decoding element (not shown). During these twelve bit periods the data outputs of the latch circuits 162-168 are coupled to the data inputs of the associated shift registers 110-116. Moreover, the counters 144-150 then receive a reset signal. The shift registers 110-116 thus receive the same relevant bit for the duration of three successive shift pulses. After this has happened the counter 120 continues counting for the remaining 48 counts needed for it to reach its end count but the shift registers are no longer activated because flip-flop 124 is reset.

FIG. 5 shows a second part of the multi-state sequencer. The data bits and redundancy bits arrive on inputs 200-206 from the series/parallel/series memories, which memories give rise to a delay equal to one picture frame period. The twelve-bit shift register memories 208-214 have a construction which corresponds to that of the elements 110-116 in FIG. 4; they serve to remove the dummy data bits from the data stream. The selectors 216-222 are similar to the selectors 128-134 of FIG. 4. They are controlled by the counters 144-150 already described with reference to FIG. 4. The incrementation of these counters ensures that the data bit which would otherwise appear at the output of the corresponding selector from the corresponding shift register at the relevant instant does not do so and hence is not processed. It should be noted that at the beginning of the line the counters 144-150 control the selectors 216-222 in such manner that the maximum delay (12 shift periods) is achieved in the shift registers 208-214; this delay is reduced by one unit each time the associated counter is incremented, so that each time this happens one (dummy) bit is suppressed. In their initial states the shift registers 208-214 thus introduce eleven bits (44 pixel periods) more delay than the shift registers 110-116 of FIG. 4. This difference must be compensated for, for example by building in an additional delay of eleven bits at the beginning of the series input register of the series/parallel/series shift register memory. Obviously this has consequences in respect of relative times at which the single storage registers must be driven, but these consequences will not be elaborated upon herein for the sake of simplicity. The four-bit shift register 224 is loaded, via the inverter 226, in response to the inverted shift pulses SH derived from the AND-gate 118 in FIG. 4. This shift register serves as a parallel/series converter. Serial shift means (4 shift pulses for each loading) have not been shown for simplicity. An appropriate means is using a lower clock division fault than the one applicable to generate the SH-series. A display apparatus may be connected to the output 228 (which corresponds to line 66 in FIG. 1b).

The previously described error detection and majority decisions are implemented in the remaining part of the circuit of FIG. 5. In contrast to the set-up shown in FIG. 3, the redundancy bits are in fact present in triplicate, as will be evident from the description of FIG. 4; each of the latch circuits 162-168 of FIG. 4, in conjunction with the switch 106, results in the triplication of exactly one bit for each television picture line. Thanks to this triple presence, a majority check can also be performed between the redundancy bits in order to detect a fault, the redundant single storage register (if any) thus indicated as being "faulty" being ignored thereafter. In the embodiment being described, therefore, at least two of the three second redundant single storage registers are required to operate correctly. On average this requirement is not excessively severe. The serial outputs of the shift registers 208-214 are connected to the inputs of respective three-bit shift registers 230-236 which receive the necessary shift pulses SH from the AND-gate 118. The delay achieved in the shift registers 208-214 for the purpose currently under discussion therefore always amounts to twelve shift periods. The outputs of the various stages of each of the shift registers 230-236 are connected in parallel to a respective two-out-of-three gating element 238-244, these elements being controlled by the contents of counters 246-252, respectively. These contents have three possible values and the counters each despatch a two-bit control signal to the relevant associated gating element. When the content of the counter 246 has the first value the gating element 238 conducts the data in the bit locations A and B, when it has its second value element 238 conducts the data in the bit locations B and C, and when it has its third value element 238 conducts the data in the bit locations A and C. The combinations of elements 232/240/248, 234/242/250 and 236/244/252 operate in an analogous manner. The counters 246-252 can receive increment signals from respective AND-gates 254-260. A reset signal for the counters 246-252 is not shown, but may be derived, for example, from a switch which activates the display apparatus. In each count state of the counter 246, the bits conducted by element 238 are compared in a comparator 262. The bits conducted by elements 240, 242 and 244 in each count state of counters 248, 250 and 252 respectively are similarly compared in the comparators 262, 266 and 268 respectively. The comparators 262-268 are activated by a signal which is derived from the count state of the program counter 120 of FIG. 4. It is thus achieved that the comparison is performed at the relative time which is indicated by the block "12" in FIG. 6, second line. When the comparator 262 supplies a signal "non-correspondence" (implying that one of the three relevant single redundant storage registers may be faulty) this signal appears on output 270 and is conducted by AND-gate 254 under the control of clock pulses (having a frequency of 17.7 MHz) on input 272. The counter 246 thus quickly counts until two corresponding bits have been found in the shift register 230 for the implementation of the majority decision. When two corresponding bits are found in the register 230, the counter 246 stops comparators 264-268, AND-gates 256-260 and counters 248-252 operate in a similar manner. When the comparator 268 detects two corresponding bits, it supplies a "correspondence" signal on line 274 to comparator 266. When the comparator 266 itself detects two corresponding bits and receives a "correspondence" signal on line 274, it outputs a "correspondence" signal on line 276. Finally, when all comparators 262-268 detect corresponding bits, a "correspondence" output signal appears on output 280. The four comparators 262-268 thus operate as a four-bit comparator (4×2) with "bit-wise non-corresponding" and "word-wise corresponding" output signals. The latter signal on the output 280 acts as an enable signal for four further comparators 282-288, each of which receives one of the data bits conducted from the shift registers 230-236. For as long as not all comparator 262-268 detect "correspondence", the comparators 282-288 remain inactive. The circuit also comprises four latch elements 290-296 which are fed by respective ones of the shift registers 208-214. The load control signal for these latch elements is derived from output 163 in FIG. 4, so that the same bits as were indicated in the arrangement of FIG. 4 and which were supplemented by way of redundancy bits are stored therein after passage through the series/parallel/series memories. In the comparators 282-288 these indicated bits are compared with the bit conducted from the associated shift register 230-236. This comparison, however, is activated only when both an enable signal appears on line 280 and a synchronization signal from program counter 120 appears on input 298. The latter signal activates the comparison at an instant which coincides with the previously described block "12" on line 2 of FIG. 6. When correspondence is detected in all comparators 282-288, nothing happens. However, should one of the comparators 282-288 detect a difference during the reception of the enable signal, the single storage register thus indicated will be faulty. The relevant comparator then supplies a logic "1" on its output (of the bundle 300), said logic "1" acting as input data for the memory 160 of FIG. 4 (and thus appearing on bundle 178). The output signals on bundle 300 are also combined in an OR-function gate (not shown) in order to form the write control signal for the read/write memory 160 (any 1s on bundle 300 resulting in a write operation). The line number which is supplied by the counter 172 on the line bundle 402 and which is conducted by the selector 400 then acts as the address, because activation of the write control signal for the memory 160 results in the selector 400 assuming the other state. In some cases it may be arranged that the occurrence of a single "1" in a given word in the memory 160 results in all the currently indicated single storage registers being indicated as faulty in which case each word need be written only once. Alternatively, a logic "0" may be replaced by a logic "1" in the relevant bit position of the currently-addressed word in the memory 160; however, in this latter case a subsequent change of this "1" back to "0" must be prevented from occurring. This can be readily achieved by constructing the memory 160 as a quadruple parallel-addressed array of 256×1 bit memories. Each of the outputs of the bundle 300 then forms the input data bit as well as the write control signal for a respective one of these memories. It should be noted that, if one of the counters 144-150 is incremented in response to a newly detected fault, a vertical row of possibly faulty pixels will be ignored on the output for the duration of one frame resulting in the temporary production of a picture having the wrong format.

The substance of FIG. 6 has already been described. The first line roughly shows the position of the 920 pixel bits within the period of a picture line. The second line indicates that a number of pixel bits are delayed in order to avoid using faulty single storage registers, and also indicates the time position of the bits which form a code by means of which errors can at least be detected. The third line shows the time necessary for the program counter to reach its maximum count and also indicates that subsequently 108 bit periods remain for other use. The periods are not all shown to scale.

There are various possibilities for the use of a memory system of the described kind as a picture memory. The indicator memory may remain connected to a stand-by voltage when the entire apparatus is switched off, so that the fault information is sustained. Alternatively, a test phase may be performed each time the mains voltage appears, after which the indicator information is correct once again. To this end a display apparatus may comprise a test pattern generator which outputs, for example, a number of picture lines containing "difficult" data such as 000 ... 000, 111 ... 11, 01010 . . . 0101 etc. The test situation may be terminated after expiration of a fixed period of time or, for example, as from the instant at which the electron gun of the cathode ray tube starts to operate.

What is claimed is:

1. A series/parallel/series shift register memory system comprising (a) a substrate on which are provided data storage positions configured to form a series input register having a serial data input, a series output register having a serial data output, and a plurality of single storage registers which link data outputs of respective stages of the series input register to data inputs of respective stages of the series output register to thereby form a parallel storage register between the series input and output registers, and (b) a transfer control device for repetitively supplying said registers with a sequence of shift signals, each sequence being such as to shift data presented to said serial data input into the series input register, to shift data present in said respective stages of the series input register in parallel into the parallel storage register, to shift data present at the output of the parallel storage register in parallel into said respective stages of the series output register, and to shift data present in the series output register to said serial data output, characterized in that it includes:

(c) a multi-state sequencer provided with means for changing the state thereof in synchronism with the occurrence of successive said sequences, said sequencer, in each state thereof,
  (i) selecting particular data from that which is presented to the serial data input and causing the total data presented to the serial data input to be supplemented with redundant data in such manner that said redundant data will be transferred to the serial data output via a different said single storage register or registers to that or those via which the selected data will be transferred, said redundant data forming an error-detection code in conjunction with the selected data,
  (ii) selecting from the data appearing at the serial data output both redundant data which has previously been applied to the serial data input and the particular data in conjunction with which this redundant data forms an error-detection code and determining therefrom whether an error has occurred in respect of the selected data, and (iii) storing indicator information in an indicator memory in response to a determination or determinations that such an error has occurred, said indicator information indicating via which said single storage register or registers the data which is in error has been transferred, and (d) means for (i) supplementing the data applied to the serial data input with dummy information in response to the presence of such indicator information in the indicator memory so that any single storage register indicated by said indicator information will be supplied only with this dummy information and (ii) processing the data appearing at said serial data output in accordance with the content of the indicator memory so as to remove therefrom any which has been transferred via a single storage register indicated by said indicator information.

2. A system as claimed in claim 1, wherein the said particular data selected in the successive states of the multi-state sequencer is such that each said single storage register via which the said total data is transferred to the serial data output transfers an item of said particular data when the sequencer is in at least one said state.

3. A system as claimed in claim 1 or claim 2, wherein the error-detection code is an error-correction code.

4. A system as claimed in claim 3, wherein the code is a majority decision code.

5. A system as claimed in claims 1 or 2, wherein the storage positions are storage positions for magnetic bubbles.

6. A system as claimed in any of claims 1 or 2, wherein the storage positions together form a charge transfer device.

7. A combination of a plurality of systems as claimed in claims 1 or 2 having a single said transfer control device in common.

8. Display apparatus including a picture memory system constituted by a series/parallel/series memory system or combination as claimed in claims 1 or 2.

* * * * *

UNITED STATES PATENT AND TRADEMARK OFFICE
CERTIFICATE OF CORRECTION

PATENT NO.   :   4,584,673
DATED        :   April 22, 1986
INVENTOR(S)  :   KAREL E. KUIJK It is certified that error appears in the above-identified patent and that said Letters Patent is hereby corrected as shown below:

Column 7, line 13, after "line" insert --)--.

Column 10, line 45, delete "positions jsix";

line 46, delete "containing information now occur in interval 44".

Column 12, line 67, change "stops comparators" to --stops. Comparators--.

Claim 1, line 30, delete "said".

Signed and Sealed this

Tenth Day of March, 1987

*Attest:*

DONALD J. QUIGG

*Attesting Officer*       *Commissioner of Patents and Trademarks*